(12) United States Patent
Chen et al.

(10) Patent No.: US 12,259,660 B2
(45) Date of Patent: Mar. 25, 2025

(54) INSPECTION METHOD AND INSPECTION PLATFORM FOR LITHOGRAPHY

(71) Applicant: INDUSTRIAL TECHNOLOGY RESEARCH INSTITUTE, Hsinchu (TW)

(72) Inventors: Cheng-Hsien Chen, Taoyuan (TW); Shu-Chun Liao, Hsinchu (TW); Shau-Wei Hsu, Hsinchu County (TW); Wei-En Fu, Taoyuan (TW); Tsung-Ying Chung, Hsinchu (TW); Yi-Chen Chuang, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 372 days.

(21) Appl. No.: 17/676,534

(22) Filed: Feb. 21, 2022

(65) Prior Publication Data

US 2023/0131662 A1 Apr. 27, 2023

Related U.S. Application Data

(60) Provisional application No. 63/272,085, filed on Oct. 26, 2021.

(30) Foreign Application Priority Data

Dec. 1, 2021 (TW) .................................. 110144747

(51) Int. Cl.
*G03F 7/00* (2006.01)
*G01J 1/42* (2006.01)

(52) U.S. Cl.
CPC .......... *G03F 7/70591* (2013.01); *G01J 1/429* (2013.01); *G01J 2001/4247* (2013.01)

(58) Field of Classification Search
None
See application file for complete search history.

(56) References Cited

U.S. PATENT DOCUMENTS

| 6,521,882 | B1 * | 2/2003 | Sumiya | ...................... G01J 1/04 |
| | | | | 356/139.01 |
| 6,684,034 | B2 * | 1/2004 | Tseng | .................. H01L 31/0203 |
| | | | | 257/E31.117 |

(Continued)

FOREIGN PATENT DOCUMENTS

| CN | 101114128 A | 1/2008 |
| CN | 205655983 U | 10/2016 |

(Continued)

OTHER PUBLICATIONS

English Translation of CN 20565583 (Year: 2016).*

(Continued)

*Primary Examiner* — Marcus H Taningco
*Assistant Examiner* — Djura Malevic
(74) *Attorney, Agent, or Firm* — Maschoff Brennan

(57) ABSTRACT

An inspection method and an inspection platform applicable for inspecting a light source used to expose a substrate. The light source is adapted to form an illuminated area on a surface of the substrate. The inspection method includes the following steps: placing at least one inspection component on the surface of the substrate; causing the at least one inspection component and the illuminated area to have a relative movement and a relative speed in a specific direction so as to make the illuminated area move across the at least one inspection component, wherein in the specific direction, the illuminated area is smaller in size than the at least one inspection component; inspecting photon energy of incident light in the illuminated area by the at least one inspection component during the relative movement; and (Continued)

determining optical values of the light source according to the photon energy and the relative speed.

27 Claims, 18 Drawing Sheets

(56) References Cited

U.S. PATENT DOCUMENTS

| | | | |
|---|---|---|---|
| 6,737,207 B2 | 5/2004 | Imai | |
| 7,053,989 B2 | 5/2006 | Kawahara | |
| 7,491,943 B2* | 2/2009 | Zeskind | G01N 15/1433 250/461.1 |
| 7,528,374 B2* | 5/2009 | Smitt | G01J 3/0202 422/82.05 |
| 7,705,331 B1* | 4/2010 | Kirk | H01J 65/04 250/493.1 |
| 7,971,492 B2* | 7/2011 | Wen | G01N 3/20 73/849 |
| 8,462,325 B2* | 6/2013 | Van Bommel | G01J 1/04 356/141.2 |
| 9,331,219 B2* | 5/2016 | Zivkovic | H01L 27/1443 |
| 10,126,659 B2 | 11/2018 | Zijp | |
| 10,649,196 B2* | 5/2020 | Osawa | G02B 27/58 |
| 10,935,673 B2 | 3/2021 | Van De Kerkhof | |
| 11,079,692 B2 | 8/2021 | Yamaguchi | |
| 11,798,966 B2* | 10/2023 | Shiota | G02B 5/003 |
| 2003/0156677 A1 | 8/2003 | Francke | |
| 2003/0209893 A1* | 11/2003 | Breed | B60R 21/01554 701/45 |
| 2005/0041226 A1 | 2/2005 | Tanaka et al. | |
| 2005/0131607 A1* | 6/2005 | Breed | B60R 25/255 701/45 |
| 2005/0173049 A1* | 8/2005 | Dona | B05D 1/28 156/239 |
| 2007/0135984 A1* | 6/2007 | Breed | B60R 21/01542 701/45 |
| 2007/0139765 A1* | 6/2007 | Daniel | G02B 6/08 385/116 |
| 2007/0188728 A1 | 8/2007 | Ohsaki | |
| 2008/0073572 A1 | 3/2008 | Schwarzl | |
| 2008/0309892 A1* | 12/2008 | Chen | G03B 27/42 355/30 |
| 2009/0066065 A1* | 3/2009 | Breed | B60R 21/0152 340/573.1 |
| 2009/0272198 A1* | 11/2009 | Wen | G01N 3/20 73/849 |
| 2010/0045955 A1* | 2/2010 | Vladimirsky | G03F 7/70916 348/86 |
| 2013/0215404 A1* | 8/2013 | Den Boef | G03F 9/7026 355/44 |
| 2015/0370175 A1* | 12/2015 | Nicolaides | G03F 7/7085 355/77 |
| 2018/0120691 A1* | 5/2018 | Driessen | G03F 1/34 |
| 2019/0107781 A1* | 4/2019 | Tinnemans | G03F 7/70625 |
| 2021/0202556 A1* | 7/2021 | Shiota | H01L 27/14625 |
| 2022/0057718 A1* | 2/2022 | Goorden | G02B 6/4298 |
| 2022/0373895 A1* | 11/2022 | Lin | G03F 7/70633 |
| 2023/0131662 A1* | 4/2023 | Chen | G03F 7/70591 250/372 |

FOREIGN PATENT DOCUMENTS

| | | | | |
|---|---|---|---|---|
| JP | 2002131662 A | 5/2002 | | |
| KR | 10-2011-0069856 A | 6/2011 | | |
| TW | M375866 U | 3/2010 | | |
| TW | 201135199 A | 10/2011 | | |
| TW | 1440842 B | 6/2014 | | |
| TW | I568264 A | 1/2017 | | |
| TW | 1621928 B | 4/2018 | | |
| TW | 202041994 A | 11/2020 | | |
| TW | 202102949 A | 1/2021 | | |
| TW | 1732058 B | 7/2021 | | |
| WO | WO-0108205 A1 * | 2/2001 | | G03F 7/70558 |
| WO | 2010/041198 A1 | 4/2010 | | |

OTHER PUBLICATIONS

English Translation of KR 20110069856 (Year: 2011).*
KR Office Action dated Mar. 13, 2024 as received in Application No. 10-2022-0034931.
Taiwan Office Action dated Aug. 2, 2022 as received in application No. 110144747.
Wang et al., "On-Wafer FinFET-Based EUV/eBeam Detector Arrays for Advanced Lithography Processes" Jun. 2020.
KR Notice of Allowance dated Dec. 27, 2024 in application 1020220034931.

* cited by examiner

INSPECTION METHOD AND INSPECTION PLATFORM FOR LITHOGRAPHY

CROSS-REFERENCE TO RELATED APPLICATIONS

This application claims the priority benefits of U.S. provisional application Ser. No. 63/272,085, filed on Oct. 26, 2021 and priority under 35 U.S.C. § 119(a) on Patent Application No(s). 110144747 filed in Taiwan (R.O.C.) on Dec. 1, 2021. The entirety of each of the above-mentioned patent application is hereby incorporated by reference herein.

TECHNICAL FIELD

The disclosure relates to an inspection method, more particularly to an inspection method and inspection platform for lithography.

BACKGROUND

In integrated circuit (IC) manufacturing, lithography is a process of transferring a mask pattern onto a substrate, such as silicon wafer. Specifically, a light source with proper wavelength (usually ultraviolet) is projected through a pattern of a mask, the transmitted image is de-magnified through some sort of lens before it exposes the photosensitive material coated on a wafer, and then the extra photosensitive material is removed as defined by the mask pattern to form the circuitry needed.

Extreme ultraviolet (EUV) lithography is known the favorite and most promising candidate among the lithography technologies and in recent years is finally moving into production. Yet, the EUV lithography still relies on the lithography equipment produced by a few specific manufacturers, thus the functions that can be operated by the semiconductor wafer manufacturers, such as the selection of the light intensity and the wavelength of EUV, are limited. Thus, the semiconductor wafer manufacturers are unable to obtain the actual values related to the light source during lithography, such as intensity, wavelength, or exposure dose (or, radiation dose). This makes the semiconductor wafer manufacturers unable to timely self-improve or control the lithography. For the similar reason, it is unable to obtain other actual values (e.g., temperature, pressure, types of particles) during other associated processes.

SUMMARY

Accordingly, the present disclosure provides an inspection method and an inspection platform which provide an approach for obtaining the actual optical properties occurring in the lithography equipment.

One embodiment of the disclosure provides an inspection method applicable for inspecting a light source used to expose a substrate. The light source is adapted to form an illuminated area on a surface of the substrate. The inspection method includes the following steps: placing at least one inspection component on the surface of the substrate; causing the at least one inspection component and the illuminated area to have a relative movement and a relative speed in a specific direction so as to make the illuminated area move across the at least one inspection component, wherein in the specific direction, the illuminated area is smaller in size than the at least one inspection component; inspecting photon energy of incident light in the illuminated area by the at least one inspection component during the relative movement; and determining optical values of the light source according to the photon energy and the relative speed.

Another embodiment of the disclosure provides an inspection platform applicable for inspecting a light source used to expose a substrate. The light source is adapted to form an illuminated area on a surface of the substrate. The inspection platform includes at least one inspection component and a controller. The inspection component is configured to be disposed on the surface of the substrate so that the at least one inspection component is movable along with the substrate so as to have a relative movement and a relative speed relative to the illuminated area and to detect photon energy of incident light in the light source. The controller is electrically connected to the at least one inspection component and is configured to determine optical values of the light source according to the relative speed and the photon energy obtained by the at least one inspection component.

According to the inspection method and the inspection platform as discussed in the above embodiments of the disclosure, the inspection component of the inspection platform can be carried by the substrate and delivered into the lithography equipment along with the substrate, thus the inspection component is allowed to timely and accurately measure, record, or analyze the actual values related to the light (e.g., light intensity, wavelength, radiation dose (or exposure dose), or energy distribution, etc.) during the lithography, providing the semiconductor wafer manufacturers an approach to improve or control the process and thereby achieving the required process stability and improving yield.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
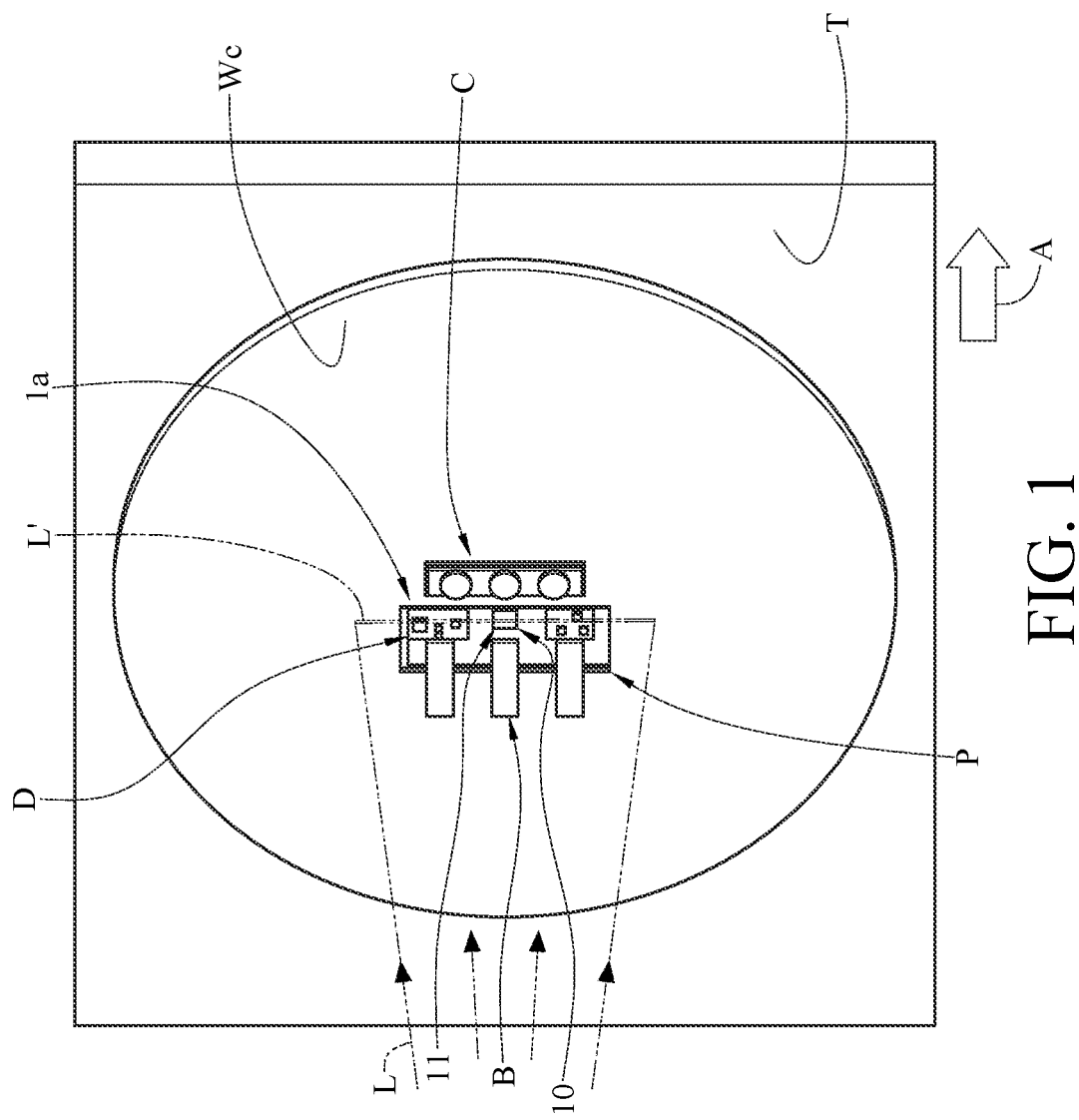
FIG. 1 depicts an inspection platform according to one embodiment of the disclosure being carried by a substrate on a platform of a lithography equipment.

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the terms "mounted," "connected," and variations thereof are used broadly and encompass both direct and indirect mountings and connections. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities. In addition, the following descriptions may use the terms "photon energy", "radiation power", "optical energy", or "luminous power" to generally represent the energy of incident light towards or received by the inspection component.

The following exemplary embodiments will be described with reference to FIGS. 1-20. For ease of explanation, some elements shown in the drawings may be simplified or illustrated by dotted lines while other elements irrelevant to the spirit of the disclosure may be omitted.

The embodiments of the disclosure provide exemplary inspection methods and inspection platforms for lithography. As seen from FIG. 1, one embodiment of the disclosure provides an inspection platform 1a having at least one inspection component 10 (can be served as a sensor). The inspection component 10 may contain any suitable electrical element that can convert optical signal to electrical signal. The inspection platform 1a is suitably applied to a substrate Wc. Specifically, the inspection platform 1a may be placed on or fixed on a specific area of the substrate We in any suitable manner. More specifically, the inspection platform 1a can be placed in an area of the substrate We which is predetermined to receive incident light during lithography. The substrate We can be supported and moved by a platform T of a lithography equipment (not shown). The substrate We serves as a carrier for moving the inspection platform 1a. Thus, the inspection platform 1a being placed on the substrate We can be supported and moved by the platform T. When the substrate We is moved by the platform T, the substrate We and the inspection platform 1a thereon can be delivered into the interior of the lithography equipment, such that the inspection component 10 of the inspection platform 1a is allowed to timely and accurately inspect, record, or analyze the actual values related to properties of light (e.g., light intensity, wavelength, radiation dose, etc.) during lithography.

The substrate We may be, but is not limited to, a silicon wafer, a glass wafer, a thinned wafer, or an etched wafer. The platform T is a means that is movable in the interior of the lithography equipment. The platform T is configured to carry a substrate We and move it into the interior of the lithography equipment. Thus, the inspection platform 1a on the substrate We can also be moved into the interior of the lithography equipment and therefore to be moved relative to a light source L during the lithography process. The light source L is employed to produce light for lithography. The light source L is able to project light with a wavelength of 365 nanometers (nm), 248 nm, 193 nm, 157 nm, or 13.5 nm towards the substrate Wc.

Additionally or optionally, the inspection platform 1a may further include a board part P, a controller DC, a charging unit C, and at least one power supply unit B. The board part P may be, but is not limited to, any suitable circuit board. The controller DC, the charging unit C, the power supply unit B, and the inspection component 10 are all disposed on or electrically connected to the board part P. The controller DC may be, but is not limited to, any suitable digital signal processing (DSP) controller. The controller DC is suitable for processing digital signal. For example, the controller DC is able to process, calculate, or analyze electrical signal that is converted from the light (also called "incident light") of the light source L by the inspection component 10. The controller DC may be able to control the way of how the inspection component 10 responds to or receives the incident light according to associated instruction or setting. The charging unit C is provided to provide electricity to the power supply unit B in a wired or wireless manner. The power supply unit B may be any suitable battery that can store and provide electrical energy for the operation required by the inspection platform 1a. In addition, optionally, to meet other requirements, such as data transmission, analysis, computing, and recording, the inspection platform 1a may contain memory or any suitable electrical element that can support wired/wireless instruction or data transmission or reading.

Figure 2:
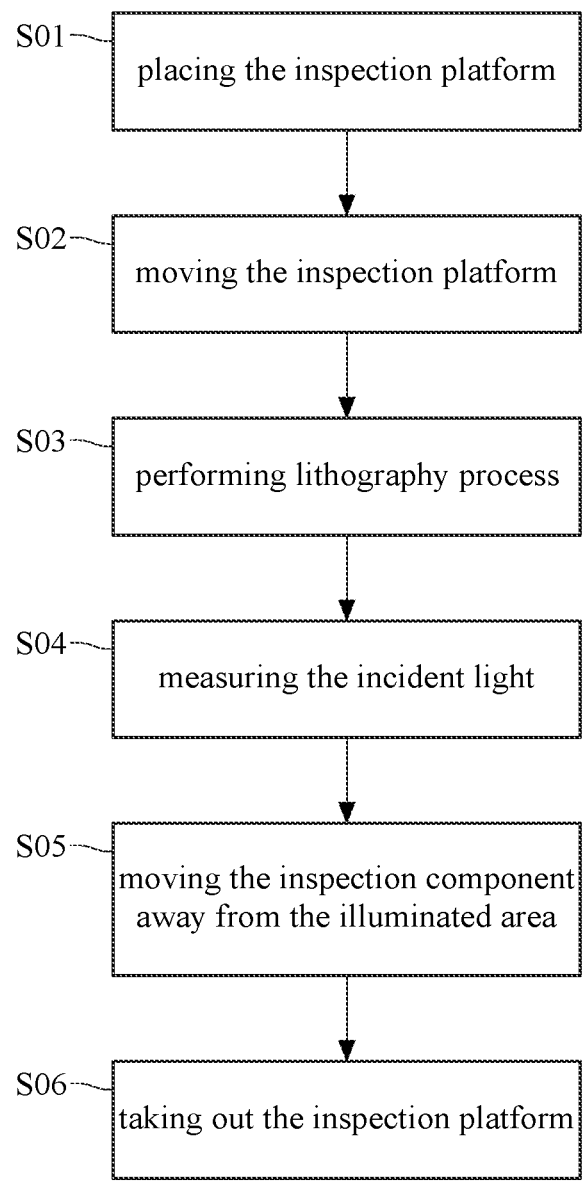
FIG. 2 depicts the flow chart showing the operation of the inspection platform in FIG. 1.

Herein, please refer to FIG. 1 and further refer to FIG. 2 to generally introduce how the inspection platform 1a measures optical properties during lithography process. Firstly, in the step S01 of placing the inspection platform 1a, the inspection platform 1a can be placed on or above the surface of the substrate Wc, such that the inspection platform 1a can be carried by the substrate We being supported by a platform (e.g., the platform T) of a lithography equipment. Then, in the step S02 of moving the inspection platform 1a, the inspection platform 1a can be moved into the interior of the lithography equipment along with the substrate We when the substrate We is moved by the platform T. As such, the inspection platform 1a can be moved to the area used to expose the substrate Wc. Then or meanwhile, in the step S03 of performing lithography process, the light source (e.g., the light source L) of lithography equipment projects light towards the predetermined area of the substrate We so that the incident light of the light source L forms an illuminated area L' on the surfaces of the substrate We and the inspection component 10, and the inspection platform 1a and the illuminated area L' will have a relative movement and a relative speed in a specific direction.

Then or meanwhile, in the step S04 of measuring the incident light, the moving path of the inspection platform 1a is the same as the moving path of the platform T, thus the inspection component 10 of the inspection platform 1a will pass through the illuminated area L' by being moved by the platform T. As such, the incident light from the light source L will cover the inspection component 10 so that the inspection component 10 is allowed to measure the actual optical properties related to the incident light used for lithography. Then, in the step S05 of moving the inspection component 10 away from the illuminated area L', the platform T keeps moving the inspection platform 1a along the moving path so that the illuminated area L' of the light source L will left the inspection component 10. Then, in the step S06 of taking out the inspection platform 1a, after the optical properties of the light source L are collected by the inspection component 10 of the inspection platform 1a, the substrate We and the inspection platform 1a thereon can be removed from the platform T. And the optical properties obtained by the inspection component 10 can be provided for later data transferring, processing, computing, and analyzing.

As the steps discussed above, the inspection platform 1a is allowed to timely and actually measure and analyze the optical properties of the incident light onto the substrate Wc, such that a control center or external computer that is wiredly or wirelessly connected to the inspection platform 1a will be able to process, calculate, or analyze the obtained optical properties so as to obtain the actual optical properties of the light source L, such as light intensity, wavelength, or exposure dose (or, radiation dose). Accordingly, although the lithography equipment may only offer a few options for the user to set up the light source (for example, intensity level 1, intensity level 2 . . . ), the inspection platform 1a provides the user an approach to obtain the actual optical properties of the light source occurring during the lithography.

In the light source L having a wavelength of 13.5 nm, the light produced by the light source is EUV light. Due to the properties of EUV or the requirements for producing EUV, it should employ a collecting and measuring approach different from the light with other wavelengths. In specific, in the case that the light source is in a wavelength of 365 nm, 248 nm, 193 nm, or 157 nm, the light source generally can produce a large illuminated area (visually apparently larger than the inspection component 10 as illustrated in the drawing) on a target surface, thus it is easy for a typical sensor to receive uniform incident light. As such, in these cases, the radiation dose can be easily obtained based on the illumination and time period. However, in EUVL (Extreme ultraviolet lithography), the illuminated area of a EUV light source generally forms a long and narrow illuminated area on the target surface; for example, as seen from the illuminated area L' formed on the surfaces of the inspection component 10 and the substrate Wc. As shown, the overlapping of the illuminated area L' and the inspection component 10 is in a size visually apparently smaller than that of the inspection component 10. In some cases, the illuminated area of a EUV light onto a target surface may have a slight curvature. As discussed, a EUV light and other light sources have such a difference in illuminated area, thus the inspection component 10 and the light source L (or, illuminated area L') are needed to have a relative movement for the inspection component 10 to measure the optical properties (e.g., light intensity, radiation dose) of the light source L (or, illuminated area L').

Figure 3:
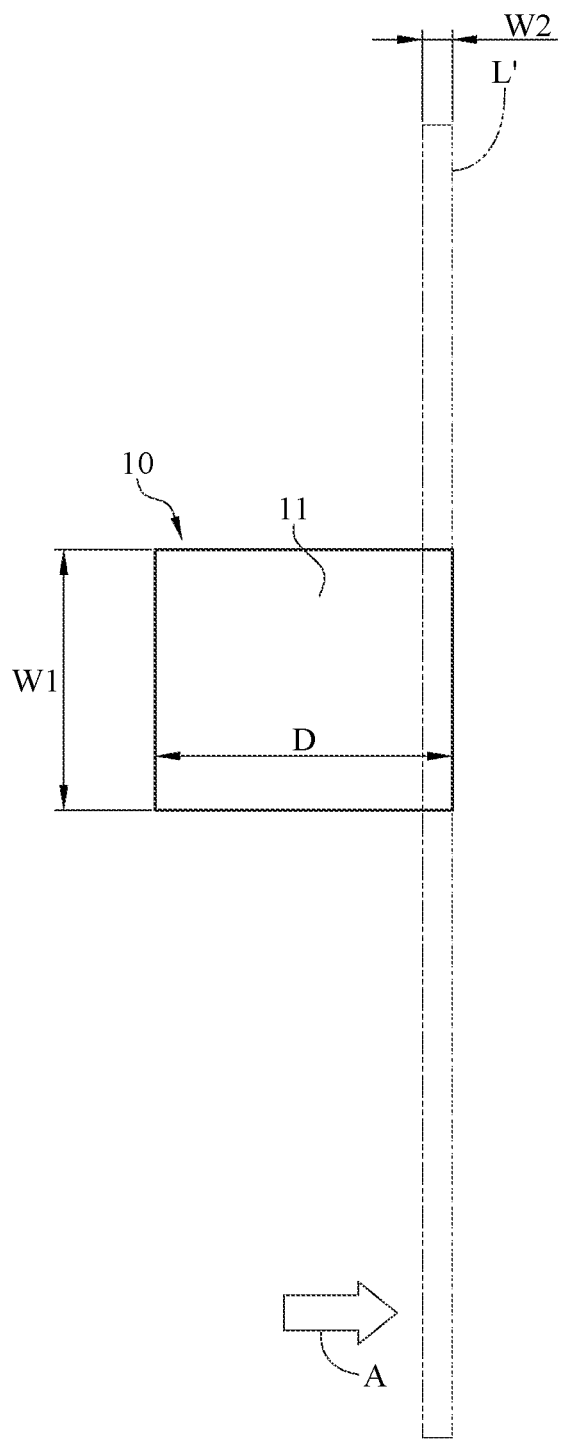
FIGS. 3-4 depict simplified views of measuring radiation dose of light source by an inspection platform according to one embodiment of the disclosure.
Figure 4:
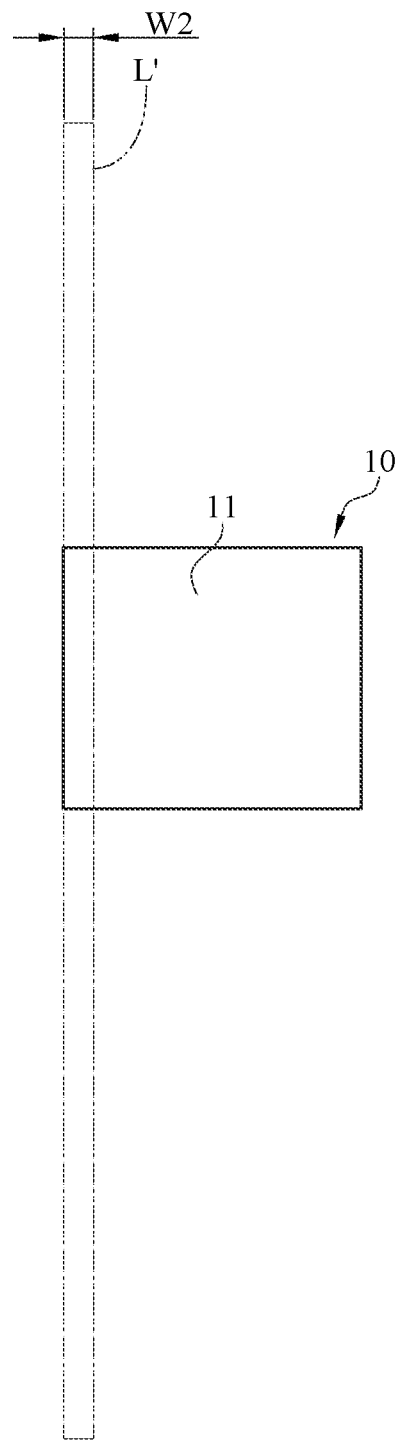
Figure 5:
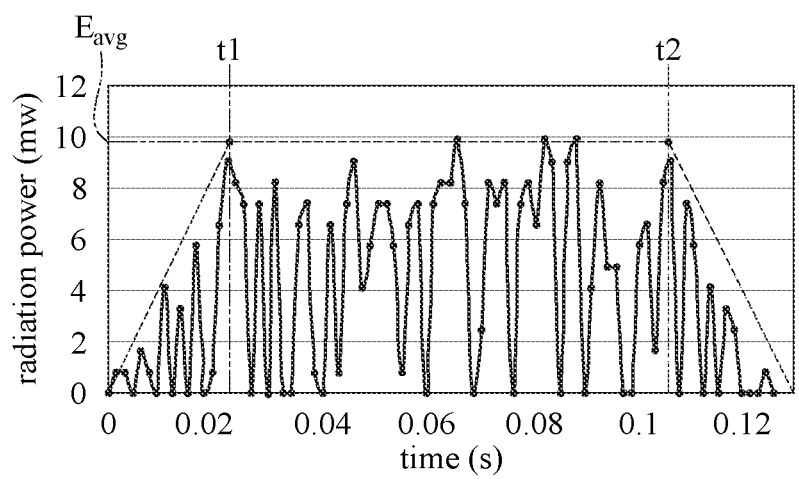
FIG. 5 is a time-varying graph when the inspection platform is detecting the radiation power of the light source.

Please refer to FIGS. 3-4 for the explanation of how the inspection component 10 measures optical properties during EUVL, where FIGS. 3 and 4 only depict the inspection component 10 and the illuminated area L' to represent the inspection platform 1a and the light source L. As shown, the inspection component 10 can be moved at a specific speed along a specific direction (as indicated by arrow A) relative to the illuminated area L' by, for example, the aforementioned platform T. The size (e.g., width W2) of the illuminated area L' in the specific direction is visually apparently smaller than the size (e.g., length D) of the inspection component 10 in the same direction. The inspection component 10 is moved at a speed "v" relative to the illuminated area L'; in other words, the relative speed of the inspection component 10 and the light source L (or, illuminated area L') is "v". As shown, the moving path or moving direction of the inspection component 10 is substantially perpendicular to a long side of the illuminated area L'; in other words, the direction of the relative movement or relative speed of the inspection component 10 and the illuminated area L' is substantially perpendicular to an extension direction of the illuminated area L'. Thus, an illuminated surface 11 (also called "active area" or "light-receiving surface") of the inspection component 10 can be moved across the illuminated area L' at speed v; in other words, the illuminated area L' can move from one side of the illuminated surface 11 to the other side of the illuminated surface 11 at a speed v. The relative movement of the inspection component 10 and the illuminated area L' makes the inspection component 10 possible to detect the wanted properties associated to incident EUV light.

When the illuminated area L' moves across the illuminated surface 11 of the inspection component 10, the inspection component 10 at least has a sampling frequency sufficient to capture a required sample size which is enough to determine the light intensity or radiation dose of the light source L. Specifically, the inspection component 10 has a sampling frequency of $f_{s1}$, the light source L has a scanning frequency of $f_{s2}$, $f_{s2}$ is equal to v/D, where D denotes the length of the inspection component 10 in the specific direction (for example, 10 mm). The sampling frequency $f_{s1}$ is at least greater than the scanning frequency $f_{s2}$, which can be represented as:

$f_{s1} \geq f_{s2} \times N$, i.e., $f_{s1} \geq (v/D) \times N$, where $f_{s1}$ denotes a sampling frequency of the inspection component 10, $f_{s2}$ denotes a scanning frequency of the light source L and is equal to v/D, N is sample size.

In one example, N may at least be 10 or more than 10 (i.e., $N \geq 10$).

Due to the aforementioned design and relative movement, the inspection component 10 is able to determine the light intensity or radiation dose of the light source L according to the photon energy (radiation power, optical energy, or luminous power) of the incident light in the illuminated area L' and the relative speed (i.e., speed v) with respect to the illuminated area L', which specifically involves the following steps.

First step is to determine a first average illumination $E_{avg}$ in a first time interval (time period) that the illuminated area L' moves across the illuminated surface 11. To this end, define t1 and t2 to be two points of time in a time-varying graph when the inspection component 10 is detecting or measuring photon energy (radiation power, optical energy, or luminous power) of the illuminated area L' moving across the illuminated surface 11. For example, t1 may denote the point of time when the illuminated area L' is just entering into the illuminated surface 11 from one side of the illuminated surface 11 and the width of the illuminated surface 11 is just completely overlapping with the illuminated surface 11 (e.g., the position shown in FIG. 3), t2 may denote another point of time when the illuminated area L' just left the other side of the illuminated surface 11 (e.g., the position shown in FIG. 4). Thus, the first time interval is represented as (t2−t1) and is equal to (D/v). The first average illumination $E_{avg}$ is represented as:

$$E_{avg} = \frac{\int_{t1}^{t2} P_{et} dt}{W1 \times D \times (t2 - t1)},$$

where t1 and t2 denote two points of time in a time-varying graph when the inspection component 10 is detecting or measuring photon energy (or, radiation power) of the illuminated area L', D denotes a length of the inspection component 10 in the specific direction of the relative speed, v denotes the relative speed between the inspection component 10 and the light source L (or, the illuminated area L'), W1 denotes another length of the inspection component 10 in another direction substantially perpendicular to the specific direction of the relative speed, (t2−t1) denotes the first time interval and is equal to D/v, $P_{et}$ denotes photon energy (or, radiation power) obtained by the inspection component 10 during the first time interval.

Then, the total amount of the radiation dose of the light source L received by the inspection component 10 during the first time interval (t2−t1) is equal to multiplying the first average illumination $E_{avg}$ by the first time interval (t2−t1) (i.e., $E_{avg} \times (t2-t1)$).

Understandably, repeating or reversely performing once or more than once the aforementioned relative movement of the illuminated area L' and the illuminated surface 11 can help determine whether the radiation dose of the light source L is stable. For example, although not shown in the drawing, the relative movement that the illuminated area L' is moved in a speed of v relative to the inspection component 10 can be performed again (alternatively, a relative movement that the inspection component 10 is moved in the speed of v in a direction opposite to the arrow A relative to the illuminated area L') to determine a second average illumination in a second time interval (time period) that the illuminated area L' moves across the illuminated surface 11. In specific, the second time interval is defined by another two points of time t3, t4, the relative speed between the inspection component 10 and the light source L (or, the illuminated area L') is still the same (i.e., v), thus the second average illumination $E'_{avg}$ is represented as:

$$E'_{avg} = \frac{\int_{t3}^{t4} P_{et} dt}{W1 \times D \times (t4 - t3)},$$

where t3 (similar to t1) denotes the point of time when the illuminated area L' is just entering into the illuminated surface 11 from one side of the illuminated surface 11 and the width of the illuminated surface 11 is just completely overlapping with the illuminated surface 11, t4 (similar to t2) denotes another point of time when the illuminated area L' just left the other side of the illuminated surface 11 (that is, t3 and t4 denote another two points of time in a time-varying graph when the inspection component 10 is detecting or measuring photon energy (or, radiation power) of the illuminated area L' passing through the illuminated surface 11), D denotes a length of the inspection component 10 in the specific direction of the relative speed, v denotes the relative speed between the inspection component 10 and the light source L (or, the illuminated area L'), W1 denotes another length of the inspection component 10 in another direction substantially perpendicular to the specific direction of the relative speed, (t4−t3) denotes the second time interval and is equal to D/v, $P_{et}$ denotes photon energy (or, radiation power) obtained by the inspection component 10 during the second time interval.

Then, the total amount of the radiation dose of the light source L received by the inspection component 10 during the second time interval (t4−t3) can be obtained by multiplying the second average illumination $E'_{avg}$ by the second time interval (t4−t3) (i.e., $E'_{avg} \times (t4-t3)$);

Then, whether the radiation dose of the light source L is stable can be determined according to the radiation dose obtained during the first time interval (t2−t1) and the radiation dose obtained during second time interval (t4−t3), which involve the following step:

Calculating a dose difference between the radiation dose obtained during the first time interval (t2−t1) and the radiation dose obtained during the second time interval (t4−t3); and When an absolute value of the dose difference is greater than or equal to a threshold value, the radiation dose of the light source L is determined to be unstable; on the contrary, when an absolute value of the dose difference is smaller than the threshold value, the radiation dose of the light source L is determined to be stable.

Note that the aforementioned inspection platform and inspection method and the inspection platform they are applied are exemplary and not limiting. Inspection platforms of other exemplary embodiments of the disclosure are provided below with reference drawings illustrated in a simplified manner. For example, the inspection platforms in the drawings related to the following descriptions may only illustrate their inspection components, and the shape of the inspection components and its proportion and size relative to other elements are for easier viewing but not limiting.

Figure 6:
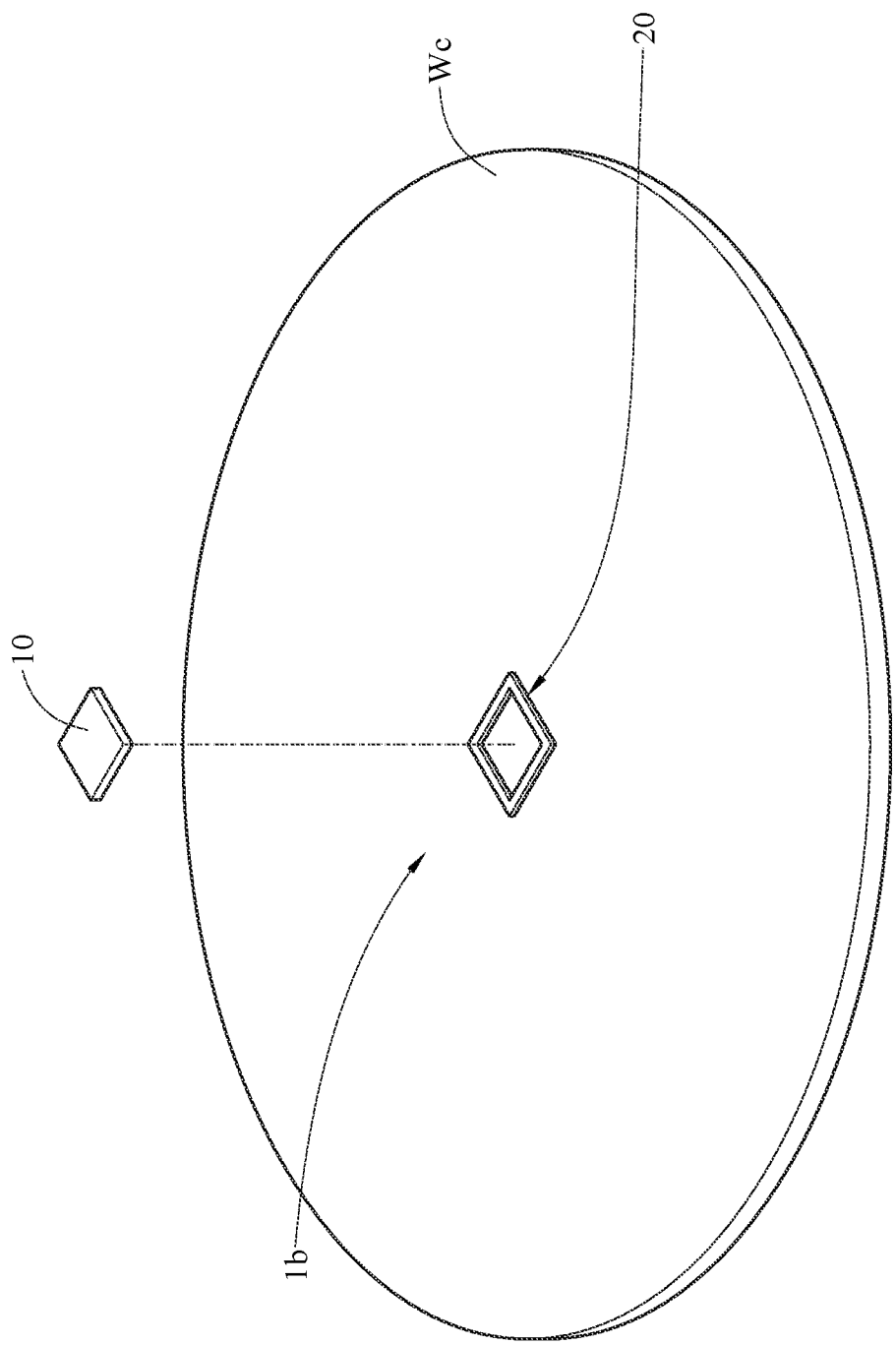
FIG. 6 depicts a simplified exploded view of an inspection platform according to another embodiment of the disclosure and a substrate.

Referring to FIG. 6, one embodiment of the disclosure provides an inspection platform 1b including a holder 20, the holder 20 may be any suitable means can be fixed on any required area of the substrate We (or the board part P as illustrated above) and is configured to releasably hold the inspection component 10 in position, such that the inspection component 10 can be easily installed or removed using the holder 20.

Figure 7:
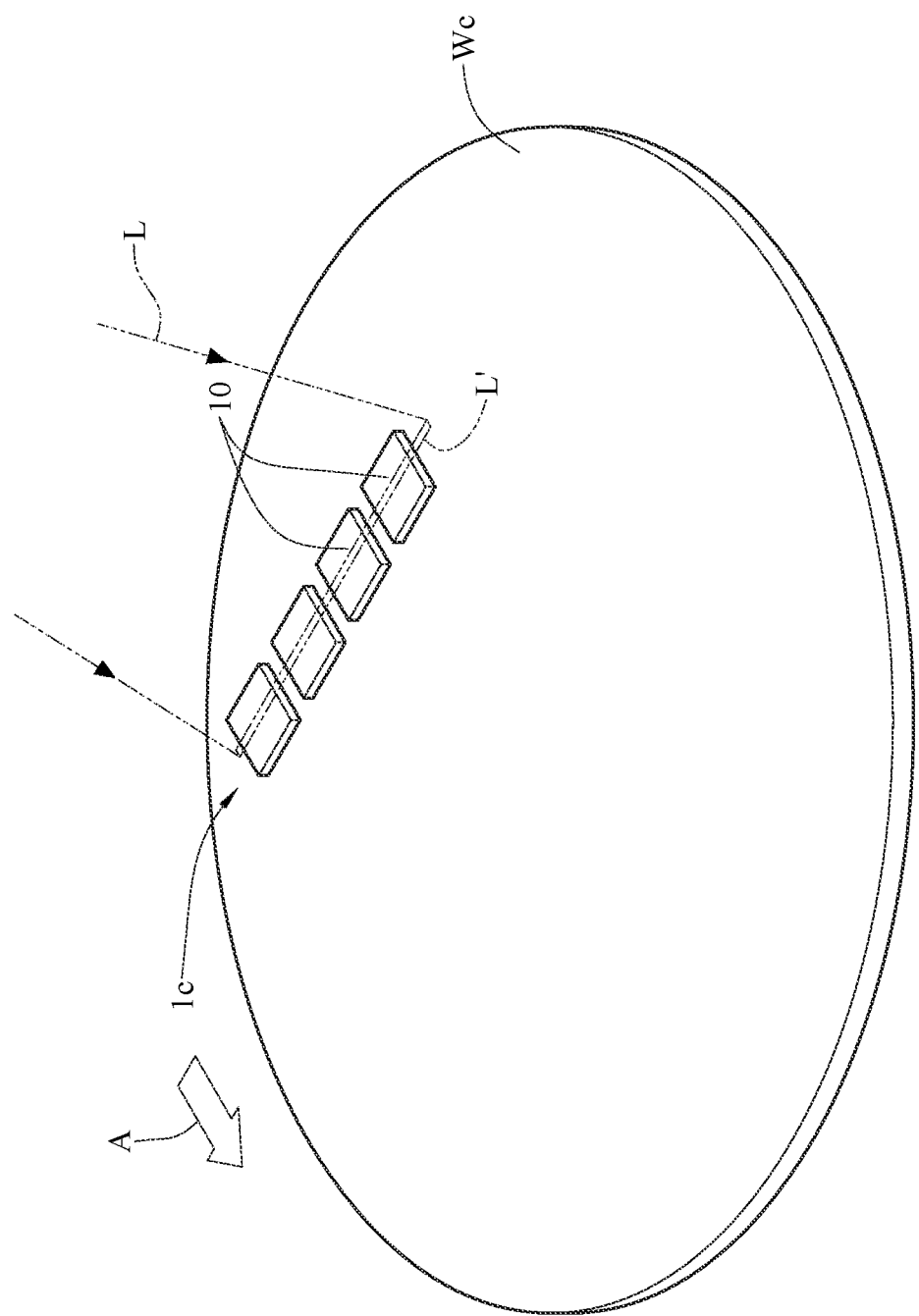
FIG. 7 depicts a simplified view of an inspection platform according to another embodiment of the disclosure being placed on a substrate.

Referring to FIG. 7, one embodiment of the disclosure provides an inspection platform 1c including a plurality of inspection components 10, the inspection components 10 may be arranged in an array. For example, the inspection components 10 may be arranged in a direction substantially perpendicular to the direction they move or may be arranged in a direction substantially perpendicular to the direction relative to the relative movement with the light source L (e.g., as indicated by the arrow A). In other words, the inspection components 10 may be arranged in a direction substantially parallel to the long side or the extension direction of the illuminated area L'. In such an arrangement, the inspection components 10 are able to receive incident light in different areas of the illuminated area L' so as to be able to determine whether the light intensity or radiation dose of the light source L is uniform. This may involve the following steps:

First is to make the plurality of inspection components 10 and the illuminated area L' have a relative movement or relative speed in a specific direction (e.g., as indicated by arrow A). For example, the plurality of inspection components 10 can be moved in a specific direction at a given speed (e.g., the aforementioned speed v) so that the plurality of inspection components 10 and the illuminated area L' will have a relative movement and a relative speed in a specific direction at a given speed.

Then, the inspection components 10 detect the incident light to obtain a plurality of photon energy during the relative movement, such that each inspection component 10 is able to determine the radiation dose of the incident light thereon according to the aforementioned inspection method that involves the calculation of the obtained photon energy and its relative speed to the illuminated area L'.

Then, whether the radiation dose of the light source L is uniform can be determined according to the radiation doses obtained by the inspection components 10, which involves the following steps:

First may be to calculate an average radiation dose of the radiation doses obtained by the inspection component 10. Then is to obtain a plurality of dose differences between the radiation doses and the average radiation dose by subtracting the average radiation dose from each of the radiation doses. When an absolute value of any one of the plurality of dose differences is greater than or equal to a threshold value, the light source L (or, the illuminated area L') is determined to be not uniform (or unstable) in radiation dose. On the contrary, when the absolute values of the dose differences are all smaller than the threshold value, the light source L (or, the illuminated area L') is determined to be uniform (or stable) in radiation dose.

Optionally, the uniformity of the radiation dose of the light source L can be determined by the steps below:

For example, a plurality of dose differences can be determined by subtracting the minimum among the radiation doses obtained by the inspection component 10 from each of the radiation doses. When an absolute value of any one of the dose differences is greater than or equal to a threshold value, the light source L (or, the illuminated area L') is determined to be not uniform (or unstable) in radiation dose. On the contrary, when absolute values of the dose differences are all smaller than the threshold value, the light source L (or, the illuminated area L') is determined to be uniform (or stable) in radiation dose.

Note that the holder 20 as illustrated in FIG. 6 may be applied to the array of the inspection components 10 in FIG. 7 or any one of the inspection components 10 in other embodiments, such that one or more inspection components 10 can be detachably installed in position using the holder 20.

Alternatively, in other embodiments, a material layer may be applied to the illuminated surface of the inspection component to select a specific wavelength range of the light source that has a specific transmittance (absorbance) to pass through; in other words, a specific material layer can be coated on the top of the inspection component to determine which wavelength range of the incident light is permitted to enter the inspection component. Thus, the inspection component is able to obtain a photon energy distribution which has a transmittance corresponding to the selected wavelength range of the incident light, such that the inspection component can specifically detect the optical properties related to the selected wavelength range of the incident light according to the obtained photon energy distribution.

Figure 8:
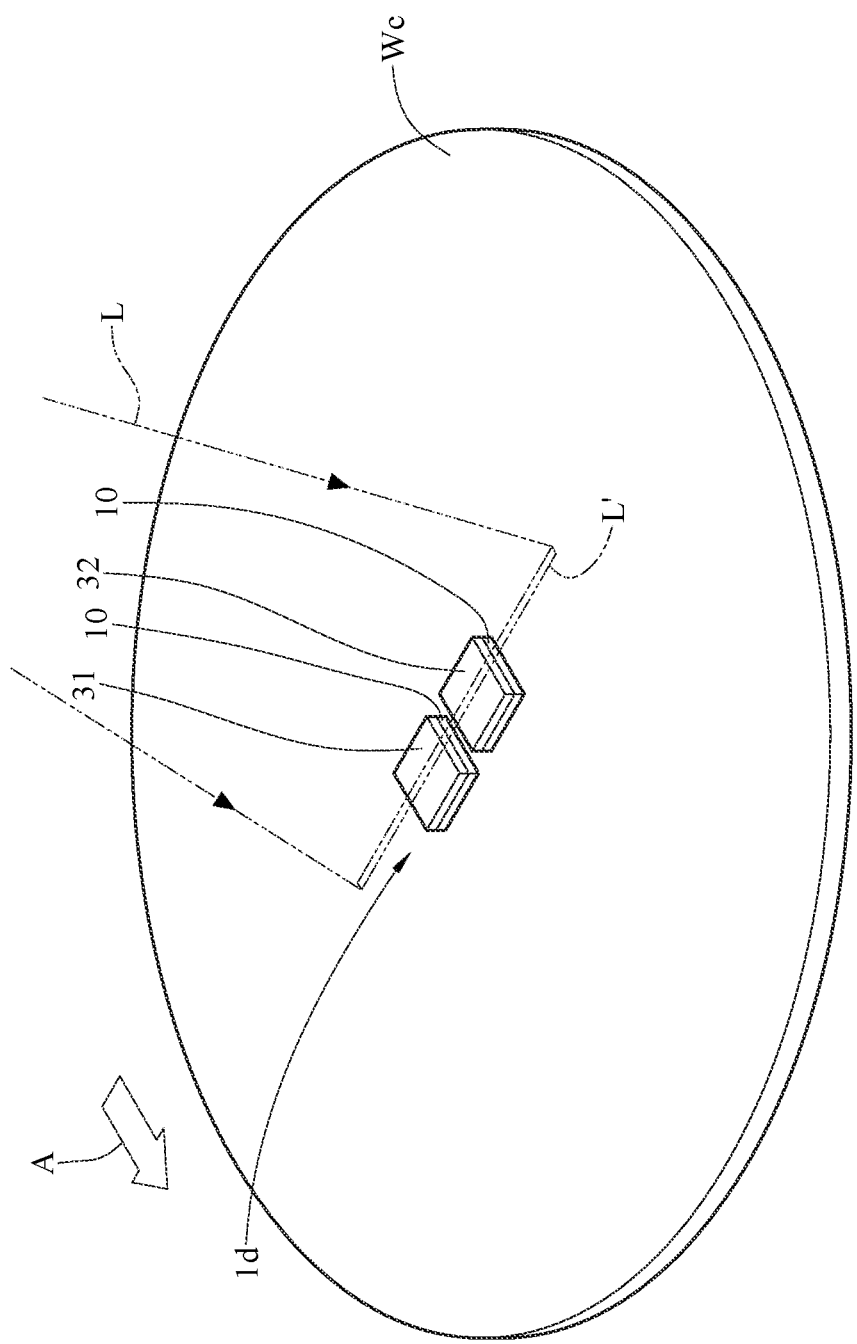
FIG. 8 depicts a simplified view of an inspection platform according to another embodiment of the disclosure being placed on a substrate.
Figure 9:
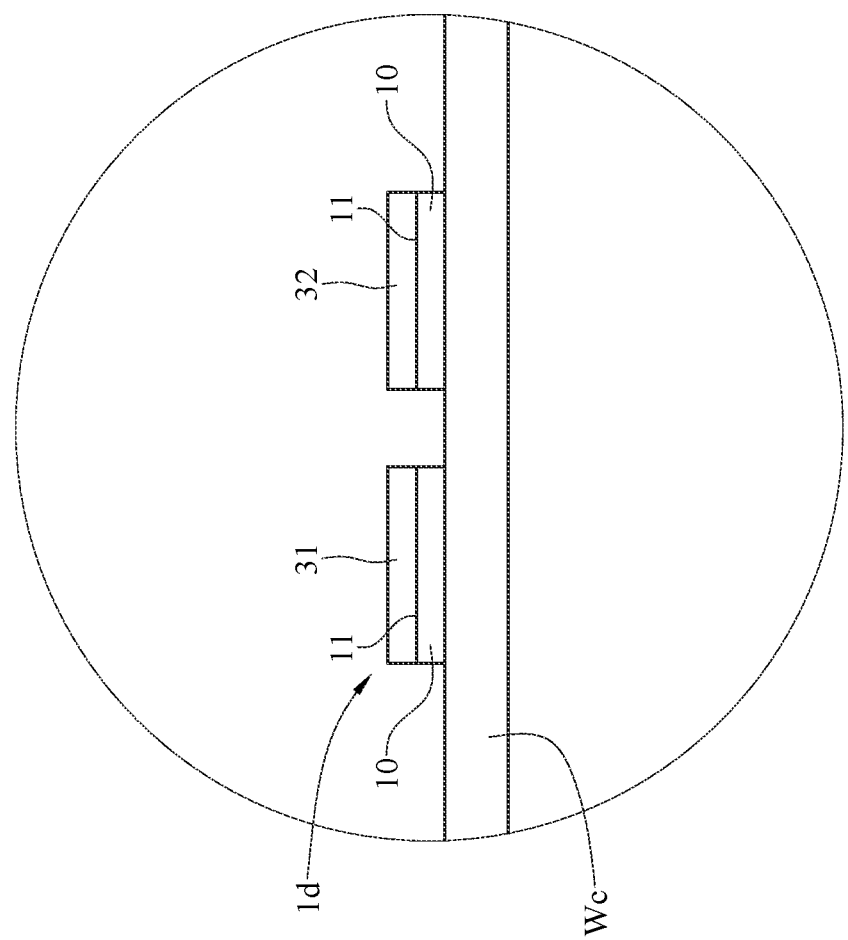
FIG. 9 is a partially enlarged view of FIG. 8.

For example, please refer to an inspection platform 1d as illustrated in FIGS. 8-9, the inspection platform 1d may include a plurality of inspection components 10, and one or more of the inspection components 10 may have a suitable material (e.g., aluminum) coated on their illuminated surfaces 11, such that the inspection components 10 that are coated with specific material are able to focus on detecting different wavelength ranges of the incident light.

As shown, the inspection components 10 may respectively have a material layer 31 and a material layer 32 coated thereon, the material layer 31 and the material layer 32 may be made of different materials and may substantially have the same thickness. Due to the properties of the material layer 31 and the material layer 32, only the specific wavelength ranges of the incident light that have specific transmittance are permitted to pass through; in other words, the properties of the material layer 31 and the material layer 32 are served to select the wavelength ranges of the incident light that are permitted to enter the inspection components 10. As such, during the relative movement of the inspection components 10 and the illuminated area L' in the specific direction, the material layers 31 and the material layers 32 are able to filter the unwanted range of incident wavelength out for the inspection components 10, thus each of the inspection components 10 is able to specifically detect the selected wavelength range of the incident light.

Figure 10:
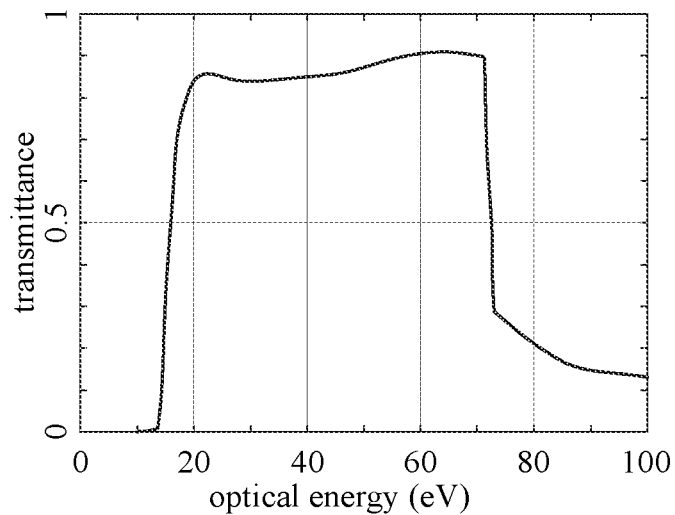
FIGS. 10-11 are graphs of transmittance and photon energy (optical energy or luminous power) of incident light obtained by different inspection components shown in the inspection platform in FIG. 8.
Figure 11:
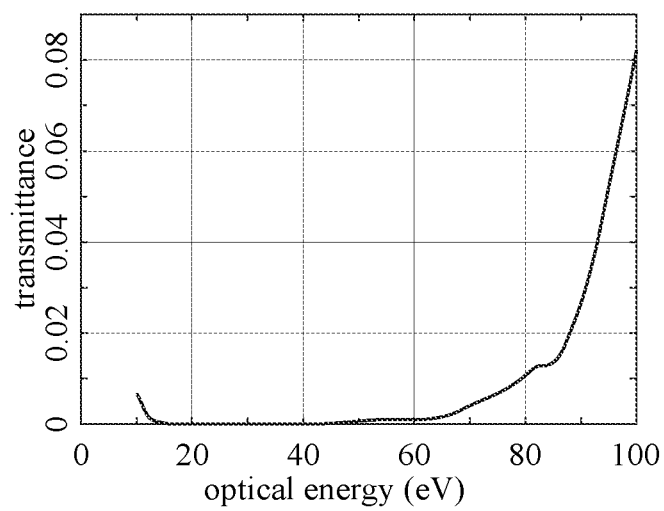

In one example with reference to FIGS. 10-11, where FIG. 10 illustrates a graph between the transmittance and the photon energy (or, a transmittance distribution related to the incident light) received by an inspection component 10 whose illuminated surface 11 is covered by, for example, a material layer 31 made of aluminum that has a density of about 2.6989 g/cm$^3$ and a thickness of about 7.0000 E-02 μm; FIG. 11 illustrates a graph between the transmittance and the photon energy received by an inspection component 10 whose illuminated surface 11 is covered by, for example, a material layer 32 made of gold that has a density of about 19.32 g/cm$^3$ and a thickness of about 7.0000 E-02 μm. In FIG. 10, the existence of the material layer 31 causes the inspection component 10 to only detect a selected wavelength range of the incident light that has a specific transmittance; in other words, the material layer 31 filters out an unwanted wavelength range of the incident light, such that the inspection component 10 obtains a specific photon energy distribution corresponding to the selected wavelength range. In FIG. 11, the existence of the material layer 32 on the other hand can cause the inspection component 10 to only detect another selected wavelength range of the incident light that has another specific transmittance; in other words, the material layer 32 filters out another unwanted wavelength range of the incident light, such that the inspection component 10 obtains another specific photon energy distribution corresponding to the selected wavelength range. Accordingly, the additional filter (e.g., the material layers 31 and 32) on the inspection components 10 can help detect whether the light source L has an error photon energy distribution in specific wavelength range. For example, when the obtained photon energy distributions are different from a predetermined photon energy distribution of the light source L, the energy distribution produced by the light source L is determined to be unstable or not uniform.

Figure 12:
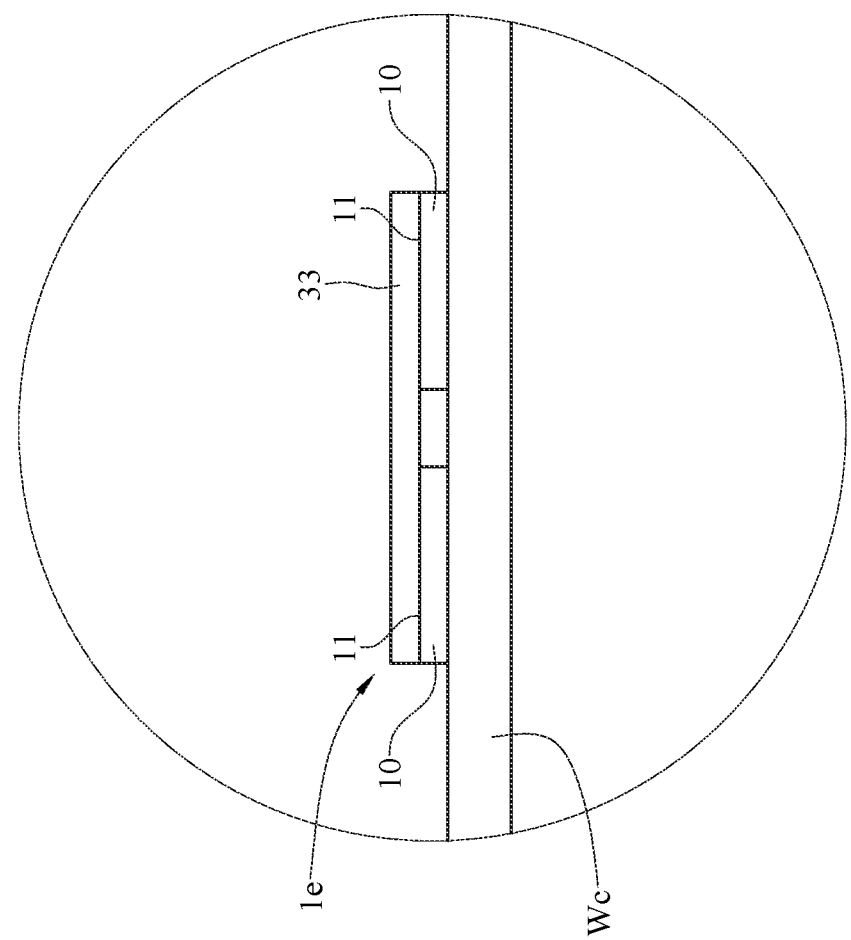
FIG. 12 is a partially enlarged view of an inspection platform according to another embodiment of the disclosure being placed on a substrate.

Alternatively, please refer to an inspection platform 1e as illustrated in FIG. 12, the inspection platform 1e may include a plurality of inspection components 10 that have a suitable material (e.g., aluminum or gold) coated on their illuminated surfaces 11. As shown, a material layer 33 in a uniform thickness covers the illuminated surfaces 11 of the inspection components 10. The material layer 33 may be, but is not limited to, the same as the aforementioned material layer 31 or 32. In this arrangement, during the relative movement of the inspection component 10 and the illuminated area L' in the specific direction, the existence of the material layer 33 can decide which range of wavelength is permitted to go into the inspection components 10; in other words, the material layer 33 is able to filter the unwanted incident wavelength out for the inspection components 10.

Further, optionally, the response levels of the inspection components 10 may be changed for the purpose of individual detection. Specifically, please refer to FIG. 13, which illustrates a graph between the transmittance and the photon energy (or, a transmittance distribution related to the incident light) received by the inspection component 10 of the inspection platform 1e whose illuminated surface 11 is covered by, for example, a material layer 33 made of aluminum that has a density of about 2.6989 g/cm$^3$ and a thickness of about 1 μm, where the rectangles in dashed line represent the response levels of the inspection component 10 that are selectable by the user (e.g., Lv1, Lv2, Lv3 shown in FIG. 13). The selection among the response levels of each inspection component 10 can further limit the incident wavelength that is currently detected by the inspection component 10. As such, by changing the response levels of the inspection components 10, the inspection components 10 will respectively have different responses to the incident light, making the inspection components 10 possible to respectively detect different incident wavelengths during the relative movement of the inspection component 10 and the illuminated area L' in the specific direction. This approach also can be used to determine whether the photon energy distribution of the light source L is stable or uniform.

Figure 13:
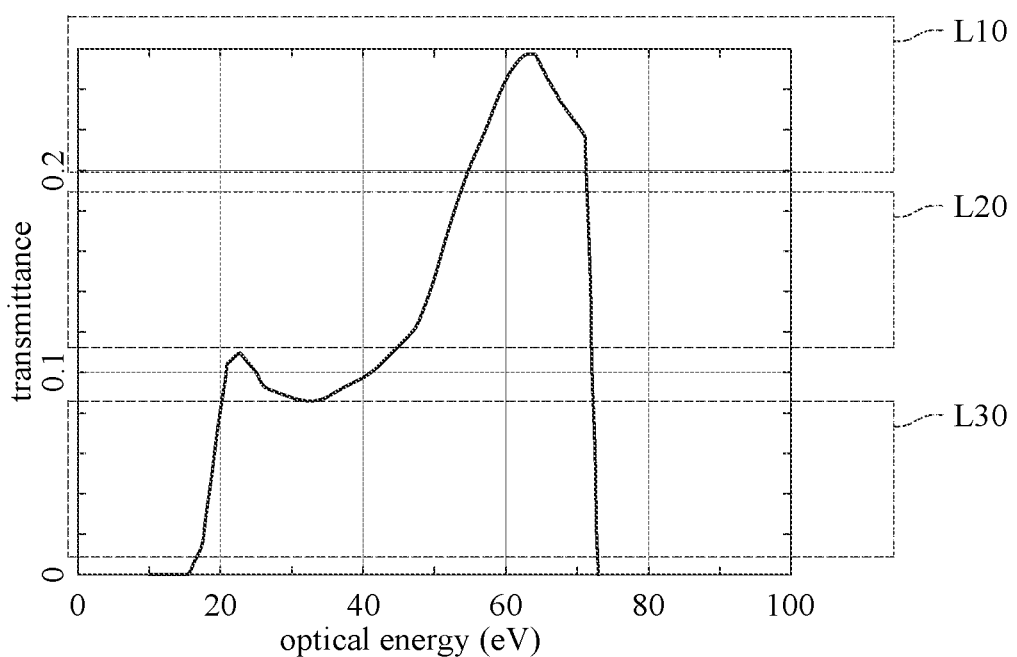
FIG. 13 is a graph of transmittance and photon energy of incident light obtained by the inspection components shown in the inspection platform in FIG. 12.

Taking Lv1 as an example, when an inspection component 10 is changed to a response level of Lv1, the inspection component 10 will be focusing on receiving the optical energy with higher transmittance. In this case, if the selected transmittance only needs to have optical energy of about 60 eV, and FIG. 13 shows that only a waveform around 60 eV appears in the selected range of transmittance (i.e., Lv1), which represents that the actual photon energy distribution in the selected range of transmittance matches the wanted photon energy distribution, and thus it can be determined that the specific wavelength range of the incident light meets the requirement for lithography. On the contrary, although not shown in the drawing, if one or more waveforms appear at the unwanted optical power, it means that the selected wavelength range has an unexpected photon energy distribution, and thus it can be determined that the selected wavelength range of the incident light is not uniform or unstable in energy distribution.

Figure 14:
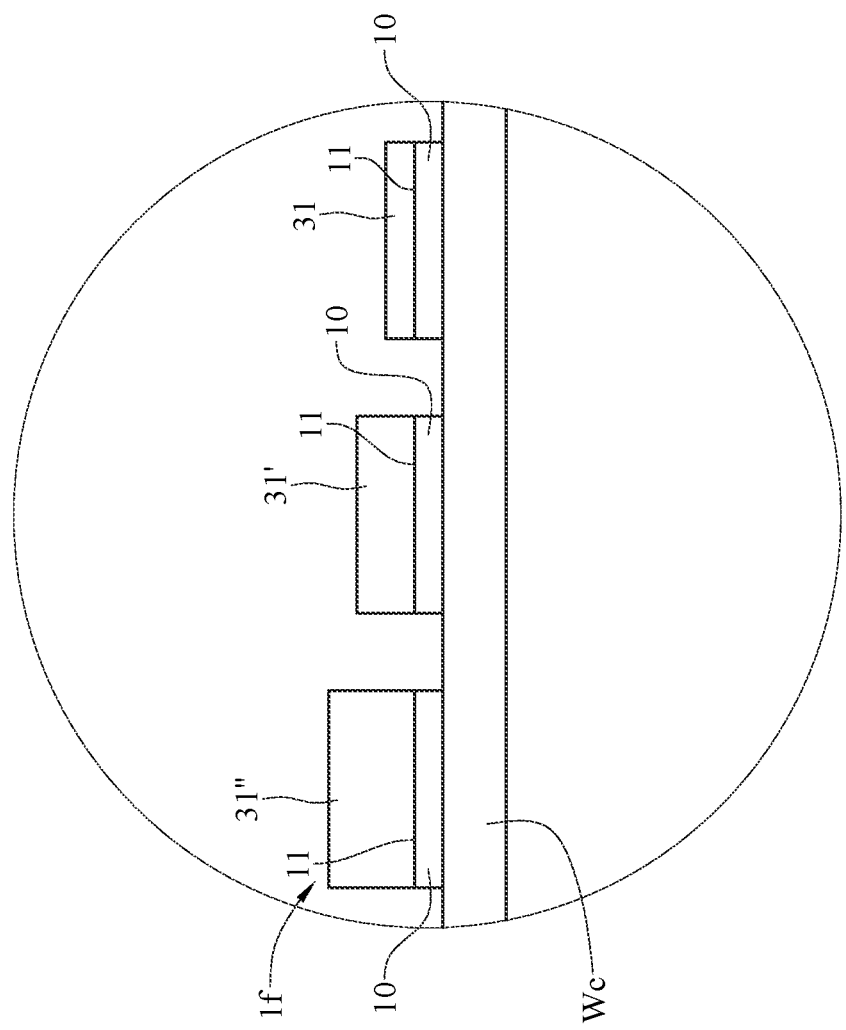
FIG. 14 is a partially enlarged view of an inspection platform according to another embodiment of the disclosure being placed on a substrate.

Then, please refer to an inspection platform 1f as illustrated in FIG. 14, the inspection platform 1f includes a plurality of inspection components 10, and the inspection components 10 may respectively be covered by material layers in the same material (e.g., aluminum or gold) but in different thicknesses. As shown, material layers 31, 31', and 31" in different thicknesses are applied on the illuminated surfaces 11 of the inspection components 10. As such, during the relative movement of the inspection components 10 and the illuminated area L' in the specific direction, since the difference in the thicknesses of the material layers 31, 31', and 31" results in different transmittance to the incident light, each of the material layers 31, 31', and 31" is able to filter an unwanted range of incident wavelength out for the respective inspection component 10. This approach can be used for the inspection components 10 to individually detect different wavelength ranges of the incident light and therefore can also be used to determine whether a specific photon energy distribution of the light source L is stable or uniform.

Figure 15:
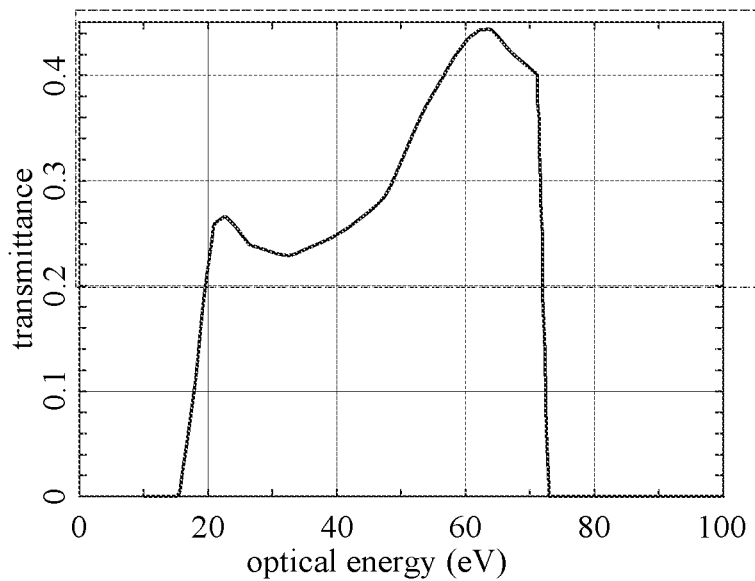
FIGS. 15-17 are graphs of transmittance and photon energy of incident light obtained by different inspection components shown in the inspection platform in FIG. 14.
Figure 16:
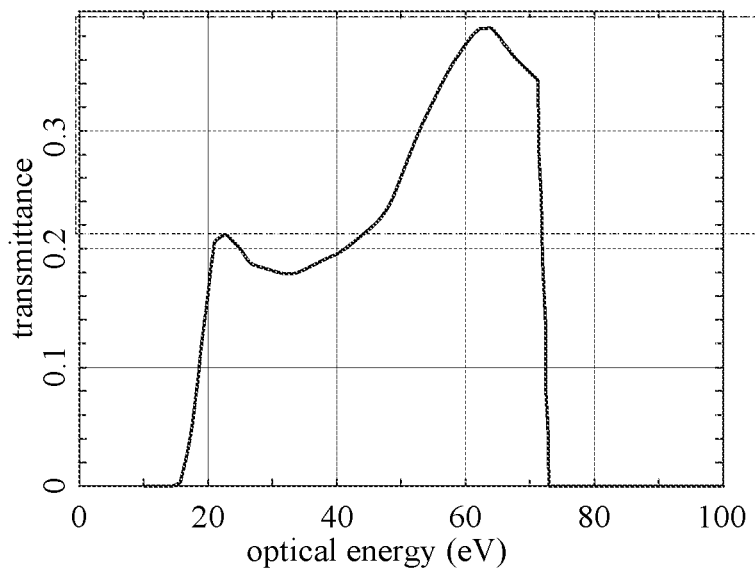
Figure 17:
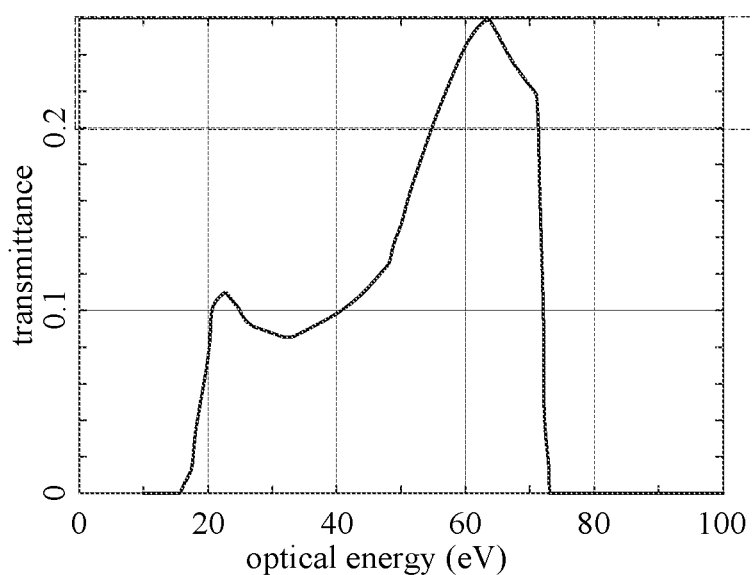

In one example, referring to FIGS. 15-17, where FIG. 15 illustrates a graph between the transmittance and the photon energy received by an inspection component 10 whose illuminated surface 11 is covered by, for example, a material layer 31 made of aluminum that has a density of about 2.6989 g/cm$^3$ and a thickness of about 0.6 μm, FIG. 16 illustrates a graph between the transmittance and the photon energy received by an inspection component 10 whose illuminated surface 11 is covered by, for example, a material layer 31' made of aluminum that has a density of about 2.6989 g/cm$^3$ and a thickness of about 0.7 μm, and FIG. 17 illustrates a graph between the transmittance and the photon energy received by an inspection component 10 whose illuminated surface 11 is covered by, for example, a material layer 31" made of aluminum that has a density of about 2.6989 g/cm$^3$ and a thickness of about 1 μm. As shown, the difference in the thicknesses of the material layer 31, 31', and 31" can help the inspection components 10 to detect the photon energy distribution of the incident light in different ranges of transmittance, thus it is also able to be used to detect whether the light source L has an error photon energy distribution. For example, when the obtained photon energy distributions are different from a predetermined photon energy distribution of the light source L, the energy distribution produced by the light source L is determined to be unstable or not uniform.

Optionally, a specific response level (e.g., the rectangles in dashed line shown in FIGS. 15-17) of the inspection components 10 covered by the material layer 31, 31', and 31" is selected by the user, such that the inspection components 10 will respectively have different responses to the incident light, making the inspection components 10 possible to respectively detect the photon energy distribution of the incident light that has a specific range of transmittance. Similarly, this approach can also be used to determine whether a specific photon energy distribution of the light source L is stable or uniform.

Figure 18:
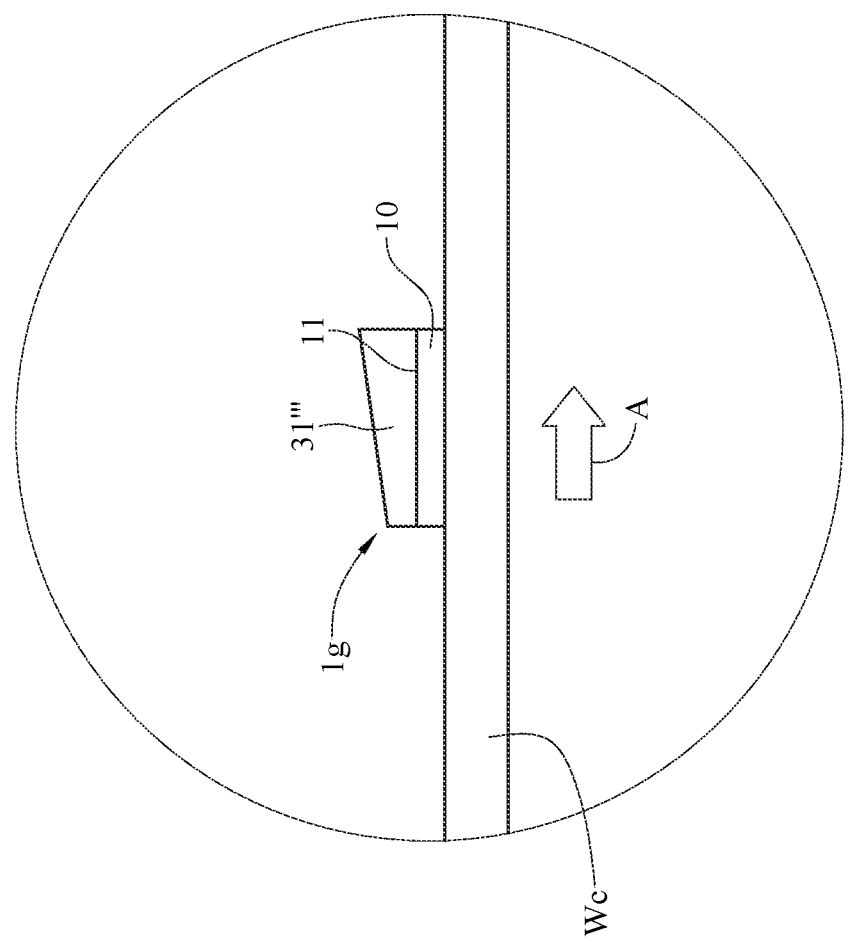
FIG. 18 is a partially enlarged view of an inspection platform according to another embodiment of the disclosure being placed on a substrate.

Alternatively, please refer to an inspection platform 1g as illustrated in FIG. 18, the inspection platform 1g has a material layer 31' covering the inspection component 10, and the material layer 31''' may be made of any suitable material (e.g., aluminum or gold). The thickness of the material layer 31' is not fixed. Specifically, the thickness of the material layer 31' varies in the direction of the relative movement or the relative speed of the inspection component 10 and the light source L (as indicated by arrow A).

In this arrangement, the variation of the thickness of the material layer 31' results in a variation of transmittance to the incident light, thus, during the relative movement of the inspection component 10 and the illuminated area L' in the specific direction, the inspection component 10 will receive different ranges of incident wavelength. As such, this approach can be used to detect different wavelength ranges of the incident light and therefore can also be used to determine whether a specific photon energy distribution of the light source is stable or uniform.

It is noted that the aspects of the previous embodiments can be applied to each other according to actual requirements. For example, a specific response level of the inspection component 10 as illustrated in FIG. 14 can further be selected by the user, such that the inspection component 10 is able to detect the photon energy distribution of the incident light that has a specific range of transmittance, allowing for the user to determine whether the photon energy distribution of the light source L is stable or uniform.

Figure 19:
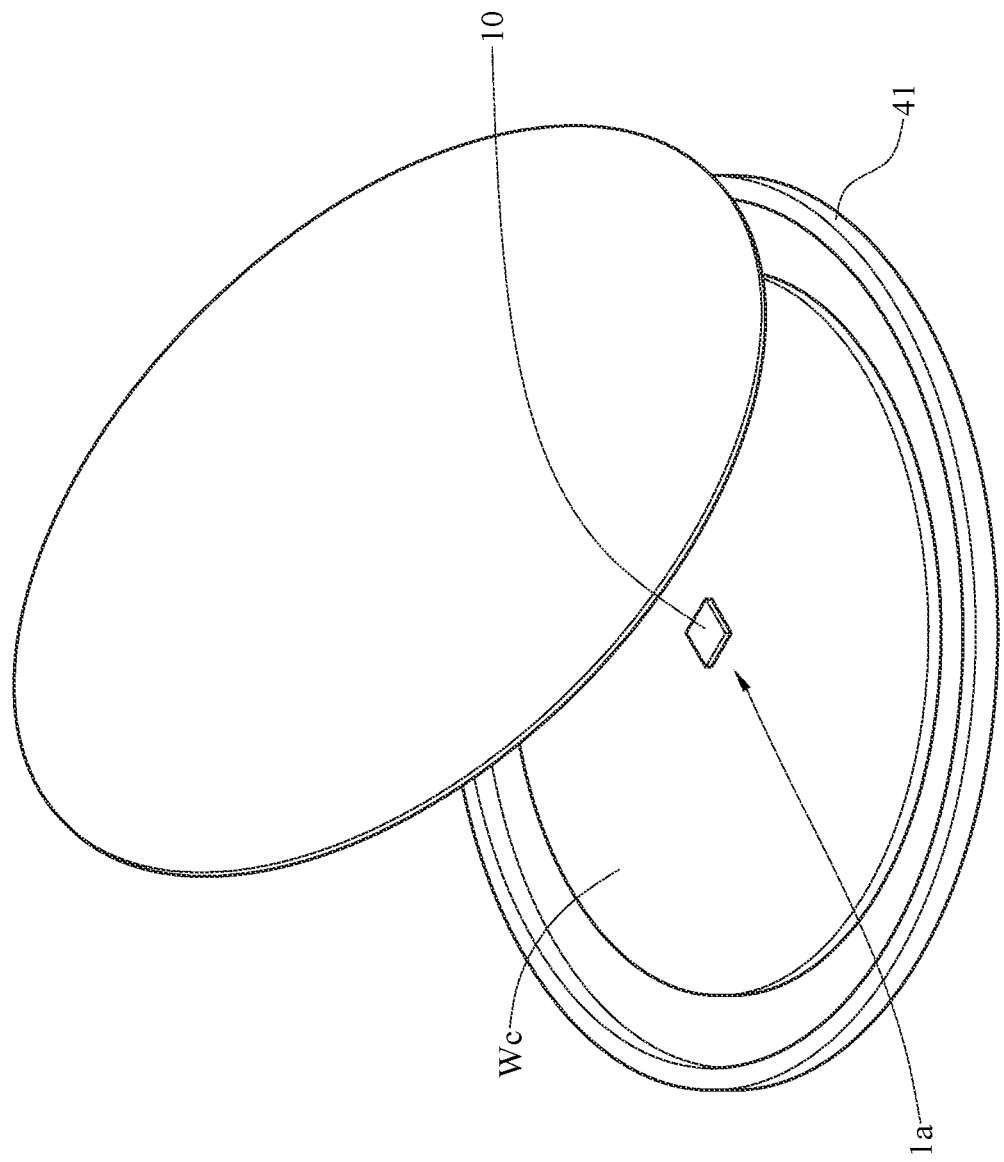
FIG. 19 is a simplified view showing an inspection platform according to another embodiment of the disclosure and a substrate are stored in a container.

Additionally or optionally, please see FIG. 19, for the purposes of, for example, charging or data transmission, any one of the previous inspection platforms (e.g., an inspection platform 1a) may be stored in a container 41 which is configured to charge and/or transmit data for the inspection component therein in a wireless or wired manner, and the container 41 is also able to transmit data to a control center (not shown) in a wireless or wired manner.

Figure 20:
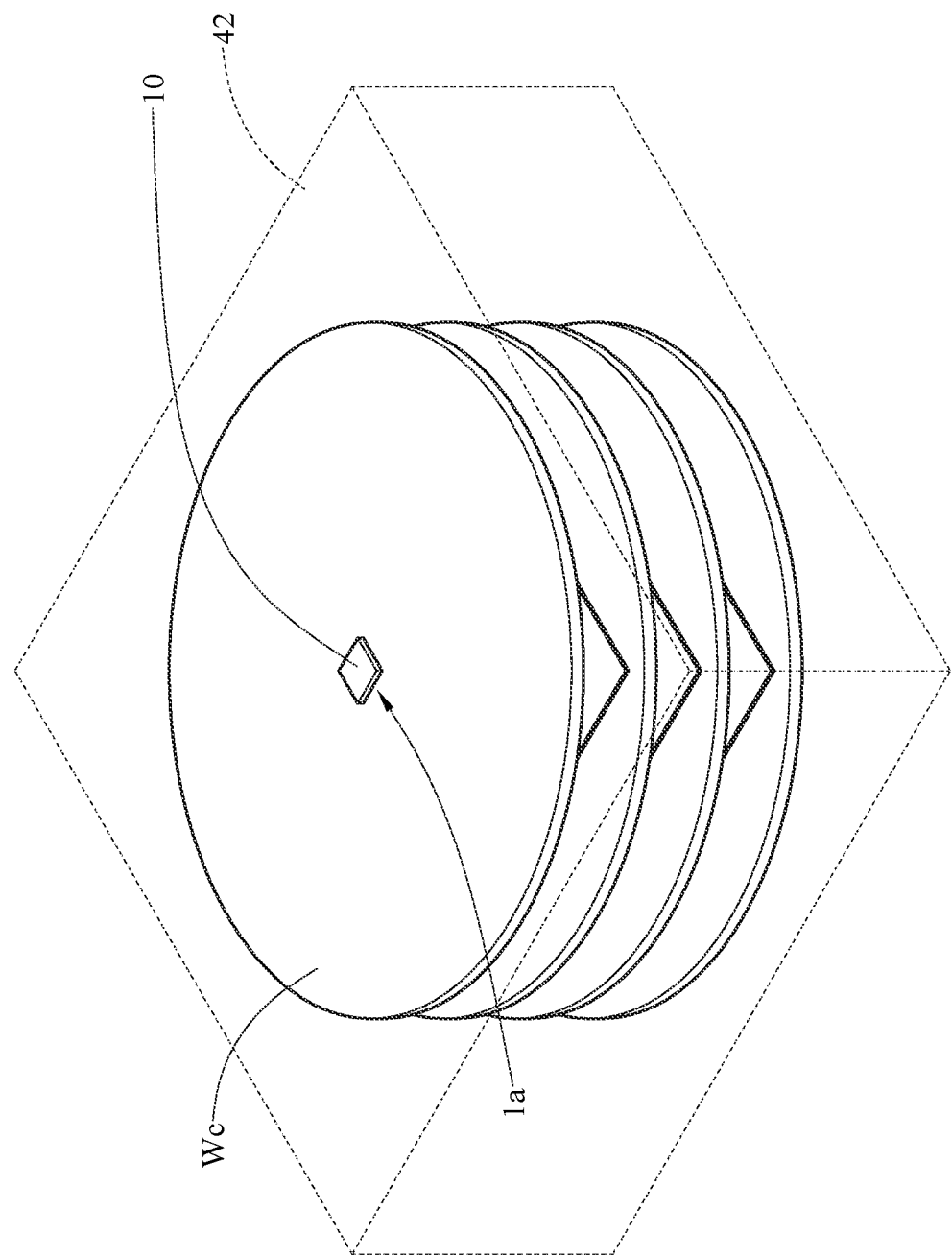
FIG. 20 is a simplified view showing inspection platforms according to embodiments of the disclosure and the associated substrates are stored in a container.

Additionally or optionally, please see FIG. 20, one or more of the inspection platforms as illustrated in the previous embodiments (e.g., the inspection platform 1a) may be stored in a container 42. The container 42 may be, but is not limited to, served as a front opening unified pod (FOUP) integrated with functions, such as wireless charging and/or wireless data transmission. Thus, the container 42 makes it possible to charge and/or transmit data for a plurality of inspection platforms together, and the container 42 is also able to transmit data to a control center (not shown) in a wireless or wired manner.

Lastly, according to actual requirements, the inspection component illustrated above may also be used to measure, record, or analyze other properties (e.g., temperature, particle state, resistance, vibration, humidity, spectrum, alignment) that occur in the interior of the lithography equipment.

According to the inspection methods and inspection platforms discussed in the above embodiments of the disclosure, the inspection component of the inspection platform can be carried by the substrate and delivered into the lithography equipment along with the substrate, thus the inspection component is allowed to timely and accurately measure, record, or analyze the actual values related to the light (e.g., light intensity, wavelength, radiation dose (exposure dose), or energy distribution, etc.) during the lithography, providing the semiconductor wafer manufacturers an approach to improve or control the process and thereby achieving the required process stability and improving yield.

In some exemplary embodiments, the inspection platform may have an array of inspection components to determine whether the properties related to the light source meet the requirements.

In some exemplary embodiments, one or more inspection components may be covered by material layers that can be in different materials or thicknesses, making the inspection component possible to focus on detecting a specific range of incident wavelength. Further, a selection among the response levels of the inspection component makes it possible to further limit the incident wavelength that is currently detected by the inspection component.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An inspection method, applicable for inspecting a light source used to expose a substrate, the light source adapted to form an illuminated area on a surface of the substrate, the inspection method comprising:
   placing at least one inspection component on the surface of the substrate;
   causing the at least one inspection component and the illuminated area to have a relative movement and a relative speed in a specific direction so as to make the illuminated area move across the at least one inspection component, wherein in the specific direction, the illuminated area is smaller in size than the at least one inspection component;
   inspecting photon energy of incident light in the illuminated area by the at least one inspection component during the relative movement; and
   determining optical values of the light source according to the photon energy and the relative speed.

2. The inspection method according to claim 1, wherein the step of determining the optical values of the light source comprises:
   determining a first average illumination in a first time interval that the illuminated area moves across an illuminated surface of the at least one inspection component, wherein the first average illumination is represented as:

$$E_{avg} = \frac{\int_{t1}^{t2} P_{et} dt}{W1 \times D \times (t2 - t1)},$$

where t1 and t2 denote two points of time in a time-varying graph when the at least one inspection component is detecting photon energy of the illuminated area, D denotes a length of the at least one inspection component in the specific direction of the relative speed, v denotes the relative speed between the at least one inspection component and the illuminated area, W1 denotes another length of the at least one inspection component in another direction substantially perpendicular to the specific direction of the relative speed, (t2−t1) denotes the first time interval and is equal to D/v, $P_{et}$ denotes photon energy obtained by the at least one inspection component during the first time interval; and determining a radiation dose of the light source obtained during the first time interval by multiplying the first average illumination by the first time interval.

3. The inspection method according to claim 2, wherein the step of determining the radiation dose of the light source comprises:
   determining a second average illumination in a second time interval that the illuminated area moves across the illuminated surface of the at least one inspection component, wherein the second average illumination is represented as:

$$E'_{avg} = \frac{\int_{t3}^{t4} P_{et} dt}{W1 \times D \times (t4 - t3)},$$

where t3 and t4 denote another two points of time in the time-varying graph when the at least one inspection component is detecting photon energy of the illuminated area, (t4−t3) denotes the second time interval and is equal to D/v, $P_{et}$ denotes photon energy obtained by the at least one inspection component during the second time interval;

determining a radiation dose of the light source obtained during the second time interval by multiplying the second average illumination by the second time interval; and determining whether the radiation dose of the light source is stable according to the radiation dose obtained during the first time interval and the radiation dose obtained during the second time interval.

4. The inspection method according to claim 3, wherein the step of determining whether the radiation dose of the light source is stable comprises:

calculating a dose difference between the radiation dose obtained during the first time interval and the radiation dose obtained during the second time interval; and determining the radiation dose of the light source to be unstable when an absolute value of the dose difference is greater than or equal to a threshold value.

5. The inspection method according to claim 1, wherein D denotes a length of the at least one inspection component in the specific direction of the relative speed, v denotes the relative speed between the at least one inspection component and the illuminated area, and the at least one inspection component satisfies the following condition:

$f_{s1} \geq f_{s2} \times N$, where $f_{s1}$ denotes a sampling frequency of the at least one inspection component, $f_{s2}$ denotes a scanning frequency of the light source and is equal to v/D, N is sample size.

6. The inspection method according to claim 5, wherein N≥10.

7. The inspection method according to claim 1, wherein the step of placing at least one inspection component on the surface of the substrate comprises:

using at least one holder to releasably hold the at least one inspection component in position on the surface of the substrate.

8. The inspection method according to claim 1, wherein the at least one inspection component comprises a plurality of inspection components, the inspection method further comprises:

causing the plurality of inspection components to have the relative movement and the relative speed relative to the illuminated area in the specific direction so as to make the illuminated area move across the plurality of inspection components;

inspecting photon energy of incident light respectively captured by the plurality of inspection components during the relative movement;

determining a plurality of radiation doses related to the light source respectively by the plurality of inspection components according to the photon energy and the relative speed; and determining whether the light source is uniform in radiation dose according to the plurality of radiation doses.

9. The inspection method according to claim 8, wherein the step of determining whether the light source is uniform in radiation dose comprises:

calculating an average of the plurality of radiation doses;

calculating a plurality of dose differences between the plurality of radiation doses and the average radiation dose; and determining the light source to be not uniform in radiation dose when an absolute value of any one of the plurality of dose differences is greater than or equal to a threshold value.

10. The inspection method according to claim 8, wherein the step of determining whether the light source is uniform in radiation dose comprises:

obtaining a plurality of dose differences by subtracting the minimum among the plurality of radiation doses from each of the plurality of radiation doses; and determining the illuminated area to be not uniform when an absolute value of any one of the plurality of dose differences is greater than or equal to a threshold value.

11. The inspection method according to claim 8, further comprising:

arranging the plurality of inspection components in a direction substantially parallel to the specific direction or a long side of the illuminated area.

12. The inspection method according to claim 1, further comprising:

applying a material layer on a surface of the at least one inspection component opposite to the substrate so as to determine which range of wavelength of incident light is permitted to enter into the at least one inspection component;

obtaining a photon energy distribution related to light passing through the material layer by the at least one inspection component; and determining an energy distribution of incident light of the light source to be not uniform when the photon energy distribution is different from a predetermined photon energy distribution related to a predetermined wavelength of the light source.

13. The inspection method according to claim 12, wherein a thickness of the material layer varies in the specific direction.

14. The inspection method according to claim 1, wherein the at least one inspection component comprises a plurality of inspection components, the inspection method further comprises:

applying a material layer on a surface of each of the plurality of inspection components opposite to the substrate, wherein the material layers are the same in thickness and are different in material, and the material layers are respectively configured to determine which range of wavelength of incident light is permitted to enter into the plurality of inspection components;

obtaining photon energy distributions related to light passing through the material layers by the plurality of inspection components; and determining an energy distribution of incident light of the light source to be not uniform when the photon energy distributions are different from a predetermined photon energy distribution related to a predetermined wavelength of the light source.

15. The inspection method according to claim 1, wherein the at least one inspection component further comprises a plurality of inspection components, the inspection method further comprises:

applying a material layer on a surface of each of the plurality of inspection components opposite to the substrate, wherein the material layers are the same in material and are different in thickness, and the material layers are respectively configured to determine which range of wavelength of incident light is permitted to enter into the plurality of inspection components;

obtaining photon energy distributions related to light passing through the material layers by the plurality of inspection components; and determining an energy distribution of incident light of the light source to be not uniform when the photon energy distributions are different from a predetermined photon energy distribution related to a predetermined wavelength of the light source.

16. The inspection method according to claim 1, further comprising:

adjusting a response level of the at least one inspection component to the incident light of the light source to obtain a photon energy distribution related to a wavelength range of the incident light that has a specific transmittance; and determining an energy distribution of the incident light of the light source to be not uniform when the photon energy distribution is different from a predetermined photon energy distribution related to a predetermined wavelength of the light source.

17. The inspection method according to one of claim 12, wherein the material layer comprises gold or aluminum.

18. The inspection method according to one of claim 12, wherein the light source has a predetermined wavelength of 13.5 nm.

19. An inspection platform, applicable for inspecting a light source used to expose a substrate, the light source adapted to form an illuminated area on a surface of the substrate, the inspection platform comprising:

at least one inspection component, configured to be disposed on the surface of the substrate so that the at least one inspection component is movable along with the substrate so as to have a relative movement and a relative speed in a specific direction relative to the illuminated area and to detect photon energy of incident light in the light source, wherein in the specific direction, the illuminated area is smaller in size than the at least one inspection component; and a controller, electrically connected to the at least one inspection component and configured to determine optical values of the light source according to the relative speed and the photon energy obtained by the at least one inspection component.

20. The inspection platform according to claim 19, wherein the substrate is a silicon wafer, a glass wafer, a thinned wafer, or an etched wafer.

21. The inspection platform according to claim 19, further comprising at least one holder configured to releasably hold the at least one inspection component in position on the surface of the substrate.

22. The inspection platform according to claim 19, further comprising a charging unit and at least one power supply unit, wherein the charging unit is configured to charge the at least one power supply unit in a wireless or wired manner, and the at least one power supply unit is configured to provide electricity to the at least one inspection component.

23. The inspection platform according to claim 19, wherein the at least one inspection component comprises a plurality of inspection components being arranged in an array.

24. The inspection platform according to claim 23, wherein the plurality of inspection components are arranged in a direction substantially parallel to the specific direction or a long side of the illuminated area.

25. The inspection platform according to claim 23, wherein a surface of each of the plurality of inspection components opposite to the substrate has a material layer thereon, and the material layers on the plurality of inspection components are the same in thickness and are different in material.

26. The inspection platform according to claim 23, wherein a surface of each of the plurality of inspection components opposite to the substrate has a material layer thereon, and the material layers on the plurality of inspection components are the same in material and are different in thickness.

27. The inspection platform according to claim 19, wherein a surface of the at least one inspection component opposite to the substrate has a material layer thereon, and a thickness of the material layer varies in the specific direction.

* * * * *